(12) United States Patent
Hayashi

(10) Patent No.: US 12,408,490 B2
(45) Date of Patent: Sep. 2, 2025

(54) LIGHT EMITTING ELEMENT

(71) Applicant: NICHIA CORPORATION, Anan (JP)

(72) Inventor: Seiichi Hayashi, Anan (JP)

(73) Assignee: NICHIA CORPORATION, Anan (JP)

( * ) Notice: Subject to any disclaimer, the term of this patent is extended or adjusted under 35 U.S.C. 154(b) by 422 days.

(21) Appl. No.: 18/158,550

(22) Filed: Jan. 24, 2023

(65) Prior Publication Data

US 2023/0307580 A1   Sep. 28, 2023

(30) Foreign Application Priority Data

Feb. 16, 2022  (JP) .................................. 2022-022046
Aug. 23, 2022  (JP) .................................. 2022-132555

(51) Int. Cl.
*H01L 33/00* (2010.01)
*H10H 20/812* (2025.01)
*H10H 20/825* (2025.01)

(52) U.S. Cl.
CPC ........ *H10H 20/825* (2025.01); *H10H 20/812* (2025.01)

(58) Field of Classification Search
None
See application file for complete search history.

(56) References Cited

U.S. PATENT DOCUMENTS

| 2007/0194330 A1 | 8/2007 | Ibbetson et al. |
| 2010/0207100 A1 | 8/2010 | Strassburg et al. |
| 2013/0221321 A1* | 8/2013 | Sheu ................. H10H 20/812 257/13 |
| 2016/0359084 A1 | 12/2016 | El-Ghoroury et al. |
| 2016/0359086 A1 | 12/2016 | El-Ghoroury et al. |
| 2016/0359299 A1 | 12/2016 | El-Ghoroury et al. |
| 2016/0359300 A1 | 12/2016 | El-Ghoroury et al. |
| 2017/0338373 A1 | 11/2017 | Wildeson et al. |
| 2019/0157505 A1 | 5/2019 | Even et al. |
| 2019/0198561 A1 | 6/2019 | Wildeson et al. |
| 2019/0259913 A1 | 8/2019 | Baek et al. |
| 2021/0328095 A1* | 10/2021 | Hayashi ............. H10H 20/8215 |

(Continued)

FOREIGN PATENT DOCUMENTS

| JP | 2009-527920 A | 7/2009 |
| JP | 2010-532926 A | 10/2010 |

(Continued)

*Primary Examiner* — Bradley Smith

(74) *Attorney, Agent, or Firm* — Foley & Lardner LLP

(57) ABSTRACT

A light emitting element comprises a first n-side semiconductor layer, a first active layer having a first well layer containing indium, a first p-side semiconductor layer, a second n-side semiconductor layer in contact with the first p-side semiconductor layer, a second active layer having a second well layer containing indium, and a second p-side semiconductor, each formed of a nitride semiconductor. The second active layer has a first intermediate layer positioned closer to the first active layer than is the second well layer and containing indium. An indium composition ratio of the first well layer is less than an indium composition ratio of the second well layer. An indium composition ratio of the first intermediate layer is less than an indium composition ratio of the first well layer. A thickness of the first intermediate layer is less than a thickness of the second well layer.

21 Claims, 7 Drawing Sheets

(56) References Cited

U.S. PATENT DOCUMENTS

| | | |
|---|---|---|
| 2022/0271199 A1 | 8/2022 | Kondo |
| 2023/0019698 A1* | 1/2023 | Funakoshi ......... H10H 20/8215 |
| 2023/0170435 A1* | 6/2023 | Abe ................. H10H 20/01335 257/13 |

FOREIGN PATENT DOCUMENTS

| | | |
|---|---|---|
| JP | 2016-181553 A | 10/2016 |
| JP | 2018-516466 A | 6/2018 |
| JP | 2019-517133 A | 6/2019 |
| JP | 2020-521312 A | 7/2020 |
| JP | 2020-182003 A | 11/2020 |
| JP | 2021-508175 A | 2/2021 |
| WO | WO-2021/106928 A1 | 6/2021 |

* cited by examiner

LIGHT EMITTING ELEMENT

CROSS-REFERENCE TO RELATED APPLICATION

This application claims priority to Japanese Patent Application No. 2022-022046, filed on Feb. 16, 2022, and Japanese Patent Application No. 2022-132555, filed on Aug. 23, 2022, the disclosures of which are hereby incorporated by reference in their entireties.

BACKGROUND

The present disclosure relates to a light emitting element. Japanese Translation of PCT International Application Publication No. JP-T-2009-527920 discloses a light emitting element including a tunnel junction and having a plurality of active regions, each emitting light of different wavelengths.

Semiconductor layers having high impurity concentrations are needed for the p-type layer and the n-type layer that form a tunnel junction. Diffusion of p-type impurity from a tunnel-junction-forming p-type layer towards the second active layer side is believed to be one of the causes of a reduced output of a light emitting element having a tunnel junction.

An object of the present disclosure is to provide a high output light emitting element.

According to an embodiment of the present disclosure, a light emitting element comprises, successively, a first n-side semiconductor layer, a first active layer having a first well layer containing indium, a first p-side semiconductor layer, a second n-side semiconductor layer in contact with the first p-side semiconductor layer, a second active layer having a second well layer containing indium, and a second p-side semiconductor, each being formed of a nitride semiconductor, wherein the second active layer has a first intermediate layer positioned closer to the first active layer than the second well layer is and containing indium, the first well layer has a lower indium composition ratio than the indium composition ratio of the second well layer, the first intermediate layer has a lower indium composition ratio than the indium composition ratio of the first well layer, and the first intermediate layer is less in thickness than the second well layer.

According to the present disclosure, a high output light emitting element can be provided.

DETAILED DESCRIPTION

Figure 1:
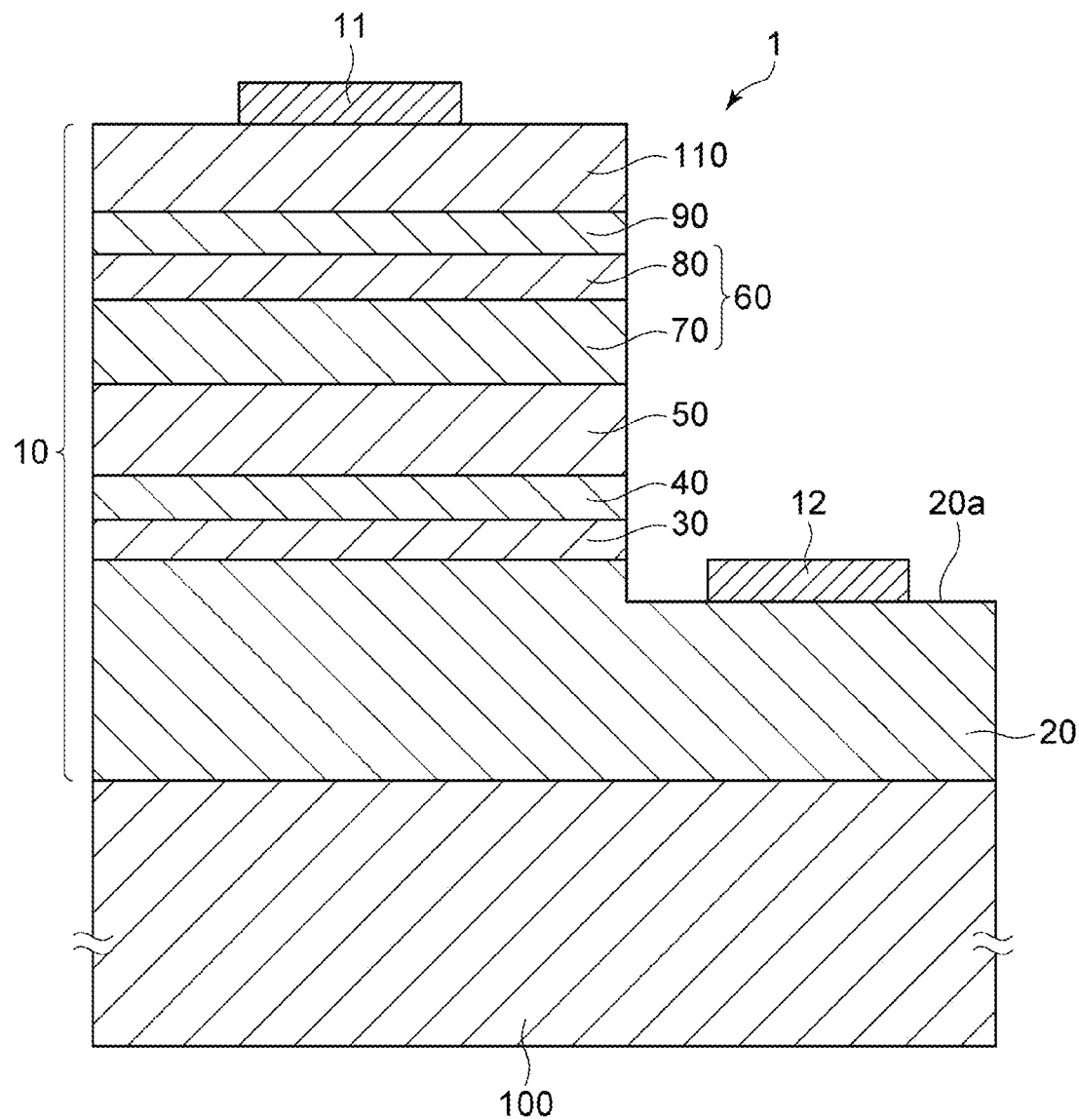
FIG. 1 is a schematic cross-sectional view of a light emitting element according to a first embodiment.

Certain embodiments will be explained with reference to the accompanying drawings In the drawings, the same reference numerals are used to denote the same elements. The drawings are schematic representations of the embodiments.

Therefore, the scale, spacing, or positional relationships of the members might be exaggerated, or a certain portion of a member omitted. An end face view showing only a cut section might be used as a cross-sectional view.

In the description below, the constituent elements having practically the same functions are denoted by common reference numerals for which explanation may be omitted. Terms indicating specific directions or positions (e.g., "upper," "on," "lower," "under," and other terms including or related to these) may be used. These terms, however, are merely used in order to make the relative directions or positions in the drawings being referenced more easily understood. As long as the relationship between relative directions or positions indicated with the terms such as "upper," "on," "lower," "under," or the like is the same as those in a referenced drawing, the layout of the elements in other drawings or actual products outside of the present disclosure does not have to be the same as those shown in the referenced drawing. The positional relationship expressed with the term "on" in the present specification includes the case in which a member is in contact with another member, and the case in which a member is not in contact with, but positioned above another member.

First Embodiment

As shown in FIG. 1, a light emitting element 1 according to a first embodiment includes a substrate 100, a semiconductor structure body 10, a p-side electrode 11, and an n-side electrode 12.

A substrate 100 supports a semiconductor structure body 10. For the material for the substrate 100, for example, sapphire, silicon, gallium nitride, or the like can be used. In the case of using a sapphire substrate as the substrate 100, the semiconductor structure body 10 is disposed, for example, on C-plane of the sapphire substrate.

A semiconductor structure body 10 includes, successively from the substrate 100 side, a first n-side semiconductor layer 20, a first active layer 40, a first p-side semiconductor layer 50, a second n-side semiconductor layer 60, a second active layer 90, and a second p-side semiconductor layer 110. The semiconductor structure body 10 can further include a first superlattice layer 30 disposed between the first n-side semiconductor layer 20 and the first active layer 40.

The first n-side semiconductor layer 20, the first superlattice layer 30, the first active layer 40, the first p-side semiconductor layer 50, the second n-side semiconductor layer 60, the second active layer 90, and the second p-side semiconductor layer 110 are individually formed of a nitride semiconductor. The nitride semiconductor can be any semiconductor obtained by varying the composition ratio x and y within their ranges in the chemical formula of $In_xAl_yGa_{1-x-y}N$ ($0 \leq x \leq 1$, $0 \leq y \leq 1$, $x+y \leq 1$). For example, the semiconductor structure body 10 can be epitaxially grown on the substrate 100.

The first n-side semiconductor layer 20 has an n-type layer containing an n-type impurity. The n-type layer contains, for example, silicon (Si) as the n-type impurity. The n-type layer may contain germanium (Ge) as the n-type impurity. The first n-side semiconductor layer 20 has only to have the function of supplying electrons, and may include an undoped layer formed without being intentionally doped with an n-type impurity or a p-type impurity. In the case in which the undoped layer is adjacent to a layer intentionally doped with an n-type impurity and/or a p-type impurity, the undoped layer might contain the n-type impurity and/or the p-type impurity diffused from the adjacent layer.

The first p-side semiconductor layer 50 and the second p-side semiconductor layer 110 each have a p-type layer containing a p-type impurity. The p-type layer contains magnesium (Mg), for example, as the p-type impurity. The first p-side semiconductor layer 50 and the second p-side semiconductor layer 110 have only to have the function of supplying positive holes, and may include an undoped layer.

The first active layer 40 and the second active layer 90 have a multi-quantum well structure including a plurality of well layers and a plurality of barrier layers as described later. The peak wavelength of the light emitted by the first active layer 90 is shorter than the peak wavelength of the light emitted by the second active layer 90. For example, the first active layer 40 emits blue light and the second active layer 90 emits green light. The peak emission wavelength of blue light is in a range of 430 nm to 490 nm. The peak emission wavelength of green light is in a range of 500 nm to 540 nm. The first active layer 40 may emit ultraviolet light. The peak emission wavelength of ultraviolet light is 410 nm or lower.

The second n-side semiconductor layer 60 is in contact with the first p-side semiconductor layer 50. The second n-side semiconductor layer 60 has a first tunnel junction layer 70 disposed in contact with the first p-side semiconductor layer 50. The first tunnel junction layer 70 in contact with the first p-side semiconductor layer 50 forms a tunnel junction with the first p-side semiconductor layer 50. The second n-side semiconductor layer 60 can further have a second superlattice layer 80 disposed between the first tunnel junction layer 70 and the second active layer 90. The first tunnel junction layer 70 includes an n-type layer having a higher n-type impurity concentration than the n-type impurity concentration of the second superlattice layer 80. The first tunnel junction layer 70 includes an n-type layer having an n-type impurity concentration, for example, of $1 \times 10^{20}/cm^3$ to $5 \times 10^{21}/cm^3$.

Providing a first superlattice layer 30 and a second superlattice layer 80 can reduce lattice mismatch between the substrate 100 and the semiconductor structure body 10, thereby reducing crystal defects in the semiconductor structure body 10.

The first n-side semiconductor layer 20 has an n-side contact face 20a on which no semiconductor layer is disposed. An n-side electrode 12 is disposed on the n-side contact face 20a. The n-side electrode 12 is electrically connected to the first n-side semiconductor layer 20.

A p-side electrode 11 is disposed on the upper face of the second p-side semiconductor layer 110. The p-side electrode 11 is electrically connected to the second p-side semiconductor layer 110.

A forward voltage is applied across the p-side electrode 11 and the n-side electrode 12. At this time, a forward current is supplied across the first active layer 40 and the second active layer 90 allowing the first active layer 40 and the second active layer 90 to emit light.

Providing a second active layer 90 on a first active layer 40 can increase the per unit area output as compared to a light emitting element having a single active layer. The light emitting element 1 outputs mixed color light of first wavelength light (e.g., blue light) emitted by the first active layer 40 and second wavelength light (e.g., green light) emitted by the second active layer 90.

When a forward voltage is applied across the p-side electrode 11 and the n-side electrode 12, a reverse voltage would apply across the second n-side semiconductor layer 60 and the first p-side semiconductor layer 50. The n-type layer and the p-type layer in the second n-side semiconductor layer 60 and the first p-side semiconductor layer 50 that form a tunnel junction having high impurity concentrations can reduce the width of the depletion layer formed by the junction between the second n-side semiconductor layer 60 and the first p-side semiconductor layer 50. This allows for the tunneling of electrons present in the valence band of the p-type layer to the conduction band of the n-type layer, thereby facilitating the current flow across the second n-side semiconductor layer 60 and the first p-side semiconductor layer 50.

The first superlattice layer 30, the first active layer 40, the second superlattice layer 80, and the second active layer 90 will be explained in detail below.

First Superlattice Layer

Figure 2:
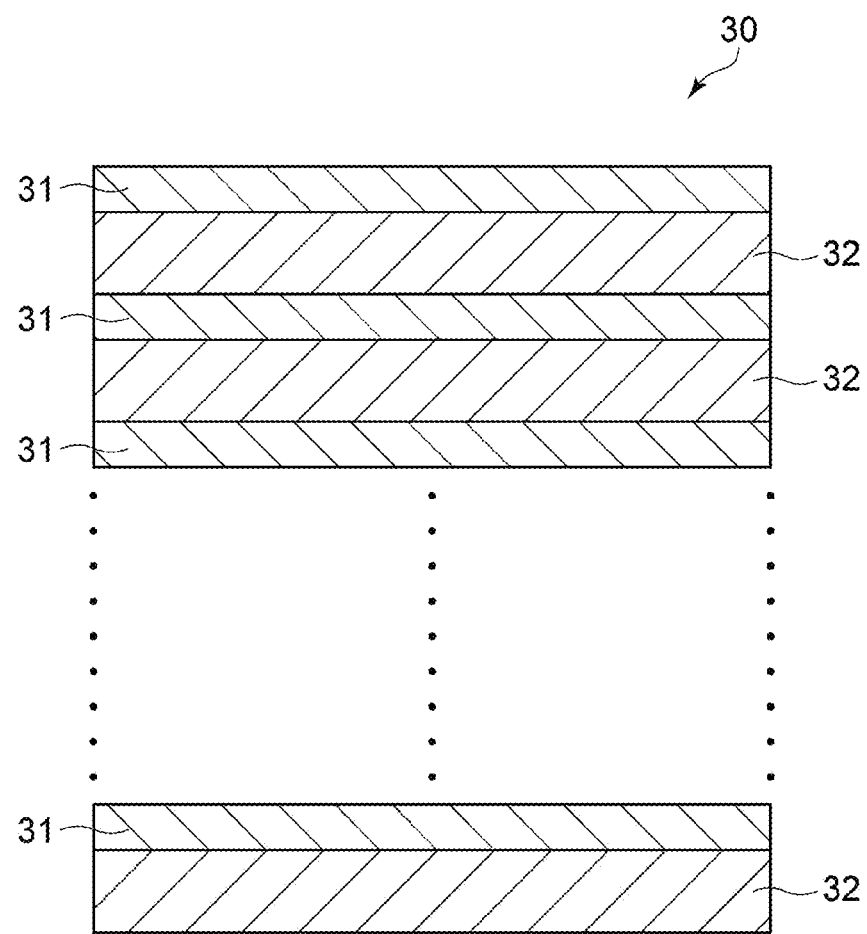
FIG. 2 is a schematic cross-sectional view explaining a first superlattice layer of the light emitting element according to the first embodiment.

As shown in FIG. 2, a first superlattice layer 30 has a plurality of third layers 31 and a plurality of fourth layers 32. The first superlattice layer 30 can have from 15 to 25 pairs of a third layer 31 and a fourth layer 32. The first superlattice layer 30 can have, for example, 20 third layers 31 and 20 fourth layers 32. In the first superlattice layer 30, a fourth layer 32 is positioned as the lowermost layer, and a third layer 31 is positioned as the uppermost layer. The fourth layers 32 and the third layers 31 are alternately disposed from the fourth layer 32 positioned as the lowermost layer to the third layer 31 positioned as the uppermost layer.

The fourth layers 32 include a fourth layer 32 positioned between two adjacent third layers 31 among the third layers 31. Furthermore, a fourth layer 32 is also positioned between the lowermost third layer 31 and the first n-side semiconductor layer 20.

The composition of the third layers 31 is different from the composition of the fourth layers 32. The third layers 31 contain indium (In). The third layers 31 are formed of undoped indium gallium nitride (InGaN), for example. The indium composition ratio of the third layers 31 can be set, for example, in a range of 3% to 10%. The fourth layers 32 are formed of undoped gallium nitride (GaN), for example. The n-type impurity concentration of the third layers 31 and the fourth layers 32 can be set, for example, in a range of $1 \times 10^{17}/cm^3$ to $1 \times 10^{19}/cm^3$. The n-type impurity concentration of the third layers 31 and the fourth layers 32 refers to the highest n-type impurity concentration in the third layers 31 and the fourth layers 32.

The thickness of the individual third layers 31 is less than the thickness of the fourth layers 32. The thickness of the individual third layers 31 can be, for example, in a range of 0.5 nm to 1.5 nm. The thickness of the individual fourth layers 32 can be, for example, in a range of 1.5 nm to 3 nm.

First Active Layer

Figure 3:
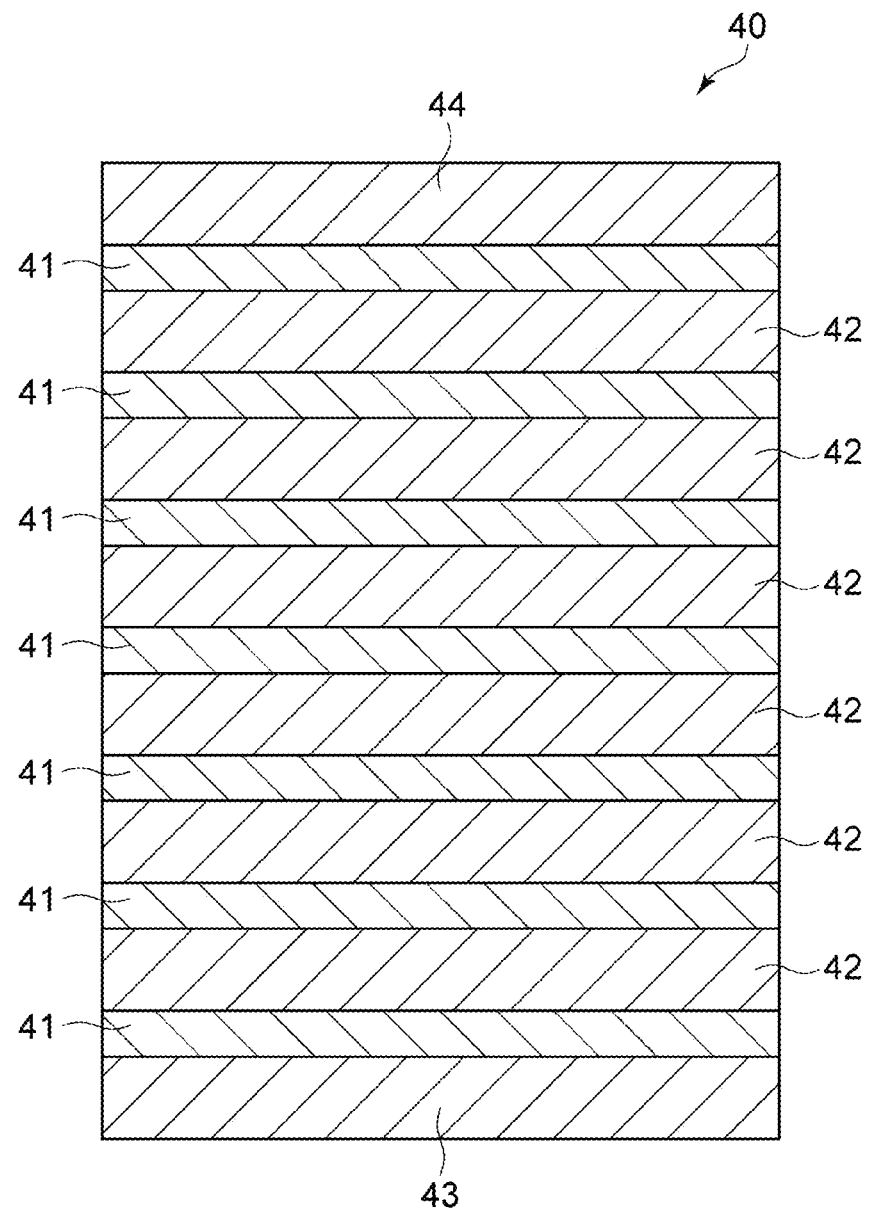
FIG. 3 is a schematic cross-sectional view explaining a first active layer of the light emitting element according to the first embodiment.

As shown in FIG. 3, a first active layer 40 has a plurality of first well layers 41 and at least one first barrier layer 42. The first active layer 40 can have, for example, 7 first well layers 41 and 6 first barrier layers 42. The individual first barrier layer 42 is positioned between two adjacent first well layers 41 among the first well layers 41. The first active layer 40 can further have a third barrier layer 43 positioned as the lowermost layer and a fourth barrier layer 44 positioned as the uppermost layer in the first active layer 40. A first well layer 41 is provided between the lowermost first barrier layer 42 among the first barrier layers 42 and the third barrier layer 43. A first well layer 41 is provided between the uppermost first barrier layer 42 among the first barrier layers 42 and the fourth barrier layer 44. The first well layers 41 and the first barrier layers 42 are alternately formed between the third barrier layer 43 and the fourth barrier layer 44.

The first well layers 41 contain indium. The first well layers 41 are formed, for example, of undoped indium gallium nitride. The indium composition ratio of the first well layers 41 can be set, for example, in a range of 12% to 18%.

The first barrier layers 42, the third barrier layer 43, and the fourth barrier layer 44 individually have a band gap larger than the band gap of a first well layer 41. The first barrier layers 42, the third barrier layer 43, and the fourth barrier layer 44 are formed, for example, of gallium nitride.

The thickness of respective of the first barrier layers 42 and the thickness of the fourth barrier layer 44 are larger than the thickness of the first well layers 41. The thickness of the respective first well layers can be set, for example, in a range of 2.5 nm to 5 nm. The thickness of respective of the first barrier layers 42, the third barrier layer 43, and the fourth barrier layer 44 can be set, for example, in a range of 3 nm to 6 nm.

Second Superlattice Layer

Figure 4:
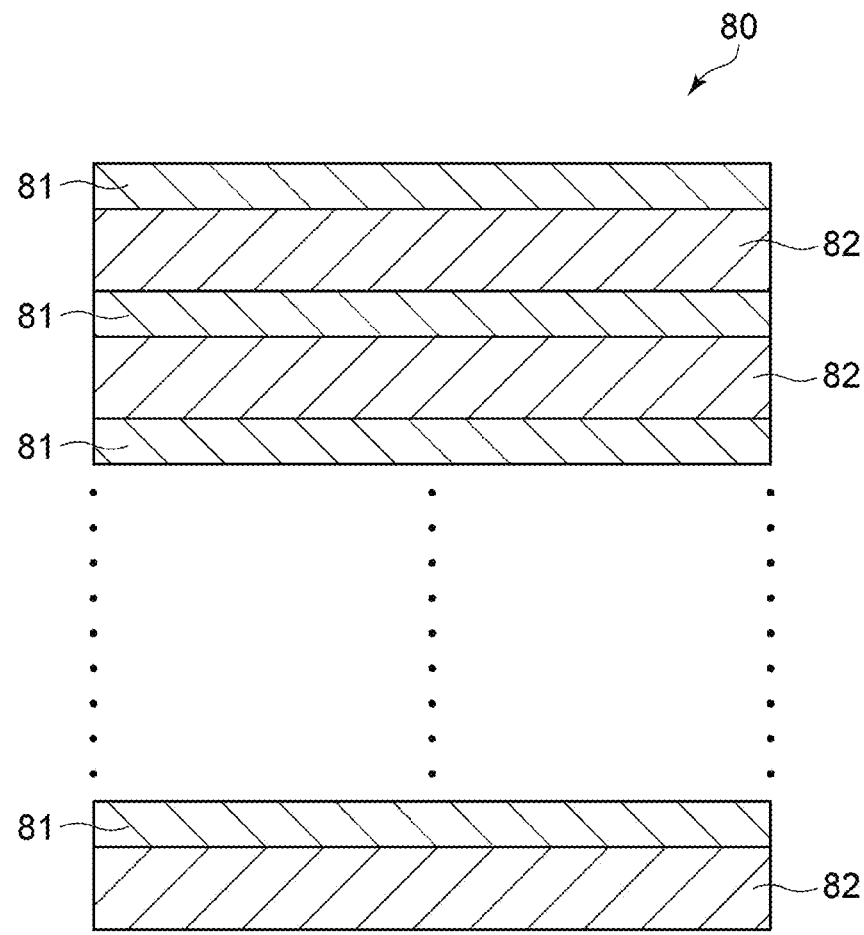
FIG. 4 is a schematic cross-sectional view explaining a second superlattice layer of the light emitting element according to the first embodiment.

As shown in FIG. 4, a second superlattice layer 80 has a plurality of first layers 81 and a plurality of second layers 82. The second superlattice layer 80 can have, for example, in a range of 15 to 25 pairs of a first layer 81 and a second layer 82. The second superlattice layer 80 can have, for example, 20 first layers 81 and 20 second layers 82. In the second superlattice layer 80, a second layer 82 is positioned as the lowermost layer, and a first layer 81 is positioned as the uppermost layer. The second layers 82 and the first layers 81 are alternately formed from the second layer 82 positioned as the lowermost layer to the first layer 81 positioned as the uppermost layer.

The second layers 82 include a second layer 82 which is positioned between two adjacent first layers 81 among the first layers 81. A second layer 82 is also provided between the lowermost first layer 81 and the first tunnel junction layer 70.

The composition of the first layers 81 differ from the composition of the second layers 82. The first layers 81 contain indium. The first layers 81 are made, for example, of silicon-doped indium gallium nitride. The indium composition ratio of the first layers 81 can be set, for example, in a range of 5% to 10%. The second layers 82 are made, for example, of silicon-doped gallium nitride. The n-type impurity concentration of the first layers 81 and the second layers 82 can be set, for example, in a range of $1 \times 10^{17}/cm^3$ to $1 \times 10^{20}/cm^3$. The n-type impurity concentration of the first layers 81 refers to the highest n-type impurity concentration in the first layers 81. The n-type impurity concentration of the second layers 82 refers to the highest n-type impurity concentration in the second layers 82.

The thickness of the individual first layers 81 is less than the thickness of the second layers 82. The thickness of the first layers 81 can be set, for example, in a range of 0.5 nm to 1.5 nm. The thickness of the second layers 82 can be set, for example, in a range of 1.5 nm to 3 nm.

Second Active Layer

Figure 5:
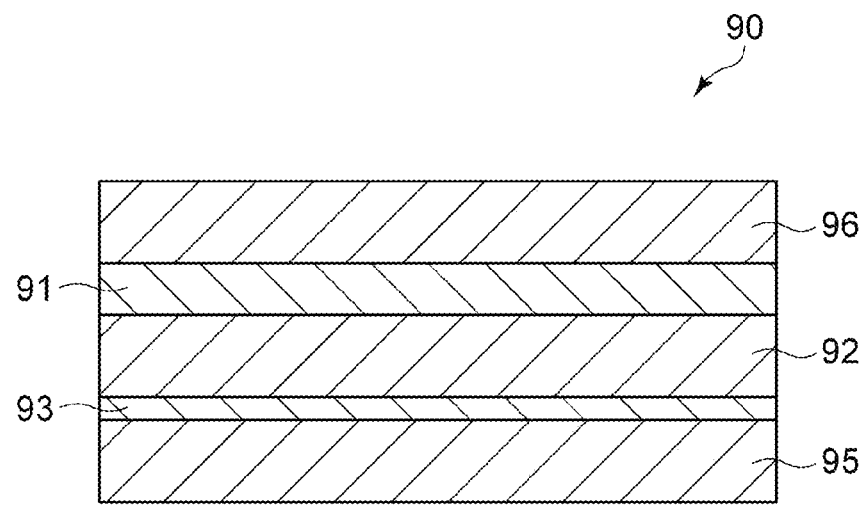
FIG. 5 is a schematic cross-sectional view explaining a second active layer of the light emitting element according to the first embodiment.

As shown in FIG. 5, a second active layer 90 has a second well layer 91, a first intermediate layer 93, a second barrier layer 92, a fifth barrier layer 95, and a sixth barrier layer 96.

FIG. 5 shows an example in which the second active layer 90 has a single second well layer 91 and a single second barrier layer 92. The second active layer 90 may have multiple pairs of a second well layer 91 and a second barrier layer 92. In this case, individual ones of the second barrier layers 92 is positioned between two adjacent second well layers 91 among the second well layers 91.

The first intermediate layer 93 is positioned closer to the first active layer 40 than the second well layer 91 is. The second barrier layer 92 is positioned between the second well layer 91 and the first intermediate layer 93. In the second active layer 90, the fifth barrier layer 95 is positioned as the lowermost layer, and the sixth barrier layer 96 is positioned as the uppermost layer. In the case in which multiple pairs of a second well layer 91 and a second barrier layer 92 are provided, the first intermediate layer 93 is positioned between the lowermost second barrier layer 92 among the second barrier layers 92 and the fifth barrier layer 95. The second well layer 91 is positioned between the second barrier layer 92 and the sixth barrier layer 96. In the case in which multiple pairs of a second well layer 91 and a second barrier layer 92 are provided, the uppermost second well layer 91 among the second well layers 91 is positioned between the uppermost second barrier layer 92 among the second barrier layers 92 and the sixth barrier layer 96.

The second well layer 91 contains indium. The second well layer 91 is formed, for example, of undoped indium gallium nitride. The indium composition ratio of the second well layer 91 is higher than the indium composition ratio of the first well layers 41 of the first active layer 40. The indium composition ratio of the second well layer 91 can be set, for example, in a range of 20% to 25%.

The first intermediate layer 93 contains indium. The first intermediate layer 93 is formed, for example, of undoped indium gallium nitride. The indium composition ratio of the first intermediate layer 93 is lower than the indium composition ratio of the first well layers 41 of the first active layer 40. The indium composition ratio of the first intermediate layer 93 is higher than the indium composition ratio of the first layers 81 of the second superlattice layer 80. The indium composition ratio of the first intermediate layer 93 can be set, for example, in a range of 8% to 12%.

The second barrier layer 92, the fifth barrier layer 95, and the sixth barrier layer 96 individually have a band gap larger than the band gaps of the second well layer 91 and the first intermediate layer 93. The second barrier layer 92, the fifth barrier layer 95, and the sixth barrier layer 96 are formed, for example, of gallium nitride.

The thickness of the first intermediate layer 93 is less than the thickness of the second well layer 91. The thickness of the first intermediate layer 93 can be set, for example, in a range of 1 nm to 2 nm. The thickness of the second well layer 91 is less than the thickness of the first well layers 41. The thickness of the second well layer 91 can be set, for example, in a range of 2 nm to 3 nm.

The thicknesses of the second barrier layer 92, the fifth barrier layer 95, and the six barrier layer 96 are all larger than the thickness of the second well layer 91. The thickness of individual ones of the second barrier layer 92, the fifth barrier layer 95, and the six barrier layer 96 can be set, for example, in a range of 3 nm to 15 nm.

According to this embodiment, positioning a first intermediate layer 93 between the second well layer 91 and the tunnel junction formed by the first p-side semiconductor layer 50 and the second n-side semiconductor layer 60 can increase the distance between the second well layer 91 and the tunnel-junction-forming p-type layer, thereby making it difficult for the p-type impurity (e.g., magnesium) to diffuse from the tunnel-junction-forming p-type layer to the second well layer 91. This can reduce the deterioration of the crystalline quality of the second well layer 91 attributable to the diffusion of p-type impurity thereto, thereby increasing the light output of the second well layer 91.

The distance between the second well layer 91 and the tunnel junction can possibly be increased by increasing the thickness of the barrier layer disposed between the second well layer 91 and the second n-side semiconductor layer 60 without disposing a first intermediate layer 93 in the second active layer 90. In this case, the barrier layer having a band gap larger than the second well layer 91 can become a barrier against the movement of electrons and positive holes to readily increase the forward voltage.

The first intermediate layer 93 having a band gap smaller than the band gaps of the second barrier layer 92 and the fifth barrier layer 95 disposed in contact with the first intermediate layer 93, as well as a thickness less than that of the second well layer 91, can achieve a tunnelling effect to reduce the forward voltage. The thickness of the first intermediate layer 93 is preferably set, for example, in a range of 1 nm to 2 nm.

The indium composition ratio of the first intermediate layer 93 being lower than the indium composition ratio of the first well layers 41 of the first active layer 40 can reduce the absorption of the light emitted by the first well layers 41 by the first intermediate layer 93. The indium composition ratio of the first intermediate layer 93 is preferably set, for example, in a range of 8% to 12%.

In order to further reduce the absorption of the light from the first well layer 41 by the second active layer 90, the quantity of second well layers 91 is preferably set to be less than the quantity of the first well layers 41.

Figure 6A:
FIG. 6A is a graph showing the output measurement results of the first wavelength light emitted by the first active layers of the light emitting element samples.

FIG. 6A is a graph showing the measurement results of the first wavelength light output by the first active layer 40 in individual ones of the light emitting element samples tested. The first wavelength light is blue light.

Samples were prepared by varying the quantity of second well layers 91 in the second active layer 90 which included no first intermediate layer 93 to be one layer, two layers, and three layers, and the first wavelength light output from the first active layer 40 of individual sample was measured. The measurement results are indicated by filled circles.

A sample in which the second active layer 90 included 1 second well layer 91 and 1 first intermediate layer 93 was prepared, and the first wavelength light output from the first active layer 40 was measured. The measurement result is indicated by the open circle.

The first wavelength light outputs shown along the vertical axis in FIG. 6A are relative values when compared to the first wavelength light output of the sample which included no first intermediate layer 93 and 3 second well layers 91 assumed as 100%.

Figure 6B:
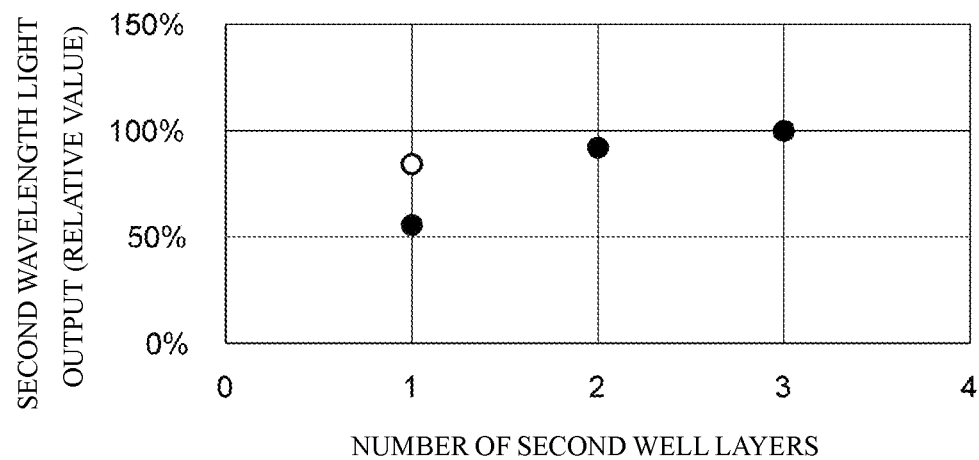
FIG. 6B is a graph showing the output measurement results of the second wavelength light emitted by the first active layers of the light emitting element samples.

FIG. 6B is a graph showing the measurement results of the second wavelength light output from the second active layer 90 in individual ones of the light emitting element samples tested. The second wavelength light is green light.

Samples were prepared by varying the quantity of second well layers 91 in the second active layer 90 which included no first intermediate layer 93 to be one layer, two layers, and three layers, and the second wavelength light output from the second active layer 90 of individual sample was measured. The measurement results are indicated by filled circles.

A sample in which the second active layer 90 included 1 second well layer 91 and 1 first intermediate layer 93 was prepared, and the second wavelength light output from the second active layer 90 was measured. The measurement result is indicated by the open circle.

The second wavelength light outputs shown along the vertical axis in FIG. 6B are relative values when compared to the second wavelength light output of the sample which included no first intermediate layer 93 and 3 second well layers 91 assumed as 100%.

Individual ones of the samples used in the measurements described above had the constituents described below.

The substrate 100 was a sapphire substrate.

The first n-side semiconductor layer 20 contained silicon as a n-type impurity. The silicon concentration of the first n-side semiconductor layer 20 was about $1 \times 10^{19}$ cm$^3$. The silicon concentration of the first n-side semiconductor layer 20 refers to the highest silicon concentration in the first n-side semiconductor layer 20. The thickness of the first n-side semiconductor layer 20 was about 10 μm.

The first superlattice layer 30 had 20 third layers 31 and 20 fourth layers 32. The third layers 31 were undoped indium gallium nitride layers. The indium composition ratio of the third layers 31 was about 7%. The thickness of the third layers 31 were about 1 nm. The fourth layers 32 were undoped gallium nitride layers. The thickness of the fourth layers 32 were about 2 nm.

The first active layer 40 had 7 first well layers 41. The first well layers 41 were undoped indium gallium nitride layers. The indium composition ratio of the first well layers 41 was about 15%. The thickness of the first well layers 41 were about 3.4 nm.

The first p-side semiconductor layer 50 contained magnesium as a p-type impurity. The magnesium concentration of the first p-side semiconductor 50 was about $3 \times 10^{20}$ cm$^3$. The magnesium concentration of the first p-side semiconductor 50 refers to the highest magnesium concentration in the first p-side semiconductor 50. The thickness of the first p-side semiconductor 50 was about 140 nm.

The first tunnel junction layer 70 included a silicon-doped n-type gallium nitride layer. The silicon concentration of the first tunnel junction layer 70 was about $8 \times 10^{20}$ cm$^3$. The silicon concentration of the first tunnel junction layer 70 refers to the highest silicon concentration in the first tunnel junction layer 70. The thickness of the first tunnel junction layer 70 was about 2 nm.

The second superlattice layer 80 had 20 first layers 81 and 20 second layers 82. The first layers 81 were silicon-doped indium gallium nitride layers. The indium composition ratio of the first layers 81 was about 7%. The thickness of the individual first layers 81 were about 1 nm. The second layers 82 were silicon-doped gallium nitride layers. The thickness of the individual second layers 82 were about 2 nm. The silicon concentration of the first layers 81 and the second layers 82 was about $2 \times 10^{19}$ cm$^3$. The silicon concentration of the first layers 81 and the second layers 82 refers to the highest silicon concentration in the first layers 81 and the second layers 82.

Individual second well layer 91 of the second active layer 90 was an undoped indium gallium nitride layer. The indium composition ratio of the individual second well layer 91 was about 23%. The thickness of the individual second well layers 91 was about 2.8 nm. In the sample in which the second active layer 90 included a first intermediate layer 93, the first intermediate layer 93 was an undoped indium gallium nitride layer. The indium composition of the first intermediate layer 93 was about 10%. The thickness of the individual first intermediate layer 93 was about 1.5 nm.

The second p-side semiconductor layer 110 contained magnesium as a p-type impurity. The magnesium concentration of the second p-side semiconductor layer 110 was about $3\times10^{20}$ cm$^3$. The magnesium concentration of the second p-side semiconductor layer 110 refers to the highest magnesium concentration in the second p-side semiconductor layer 110. The thickness of the second p-side semiconductor layer 110 was about 115 nm.

As shown in FIG. 6A, as to the samples not including a first intermediate layer 93 (the measurement points indicated by filled circles), as the quantity of second well layers 91 decreased, the absorption of the first wavelength light (blue light) in the second well layer(s) 91 tended to decline to increase the first wavelength light output.

On the other hand, as shown in FIG. 6B, as to the samples not including a first intermediate layer 93 (the measurement points indicated by filled circles), as the quantity of second well layers 91 decreased, the second wavelength light (green light) output tended to decrease.

The sample having 1 second well layer 91 and 1 first intermediate layer 93 was able to achieve a higher second wavelength light output (the open circle in FIG. 6B) than the sample having one second layer 91 and no first intermediate layer 93, while maintaining almost the same first wavelength light output (the open circle in FIG. 6A) as that of the sample which had one second layer 91 and no first intermediate layer 93. Furthermore, the sample having 1 second well layer 91 and 1 first intermediate layer 93 was able to increase the output of the light emitting element output combining the first wavelength light output and the second wavelength light output, as compared to the sample which had three second well layers 91 and no first intermediate layer 93.

Second Embodiment

Figure 7:
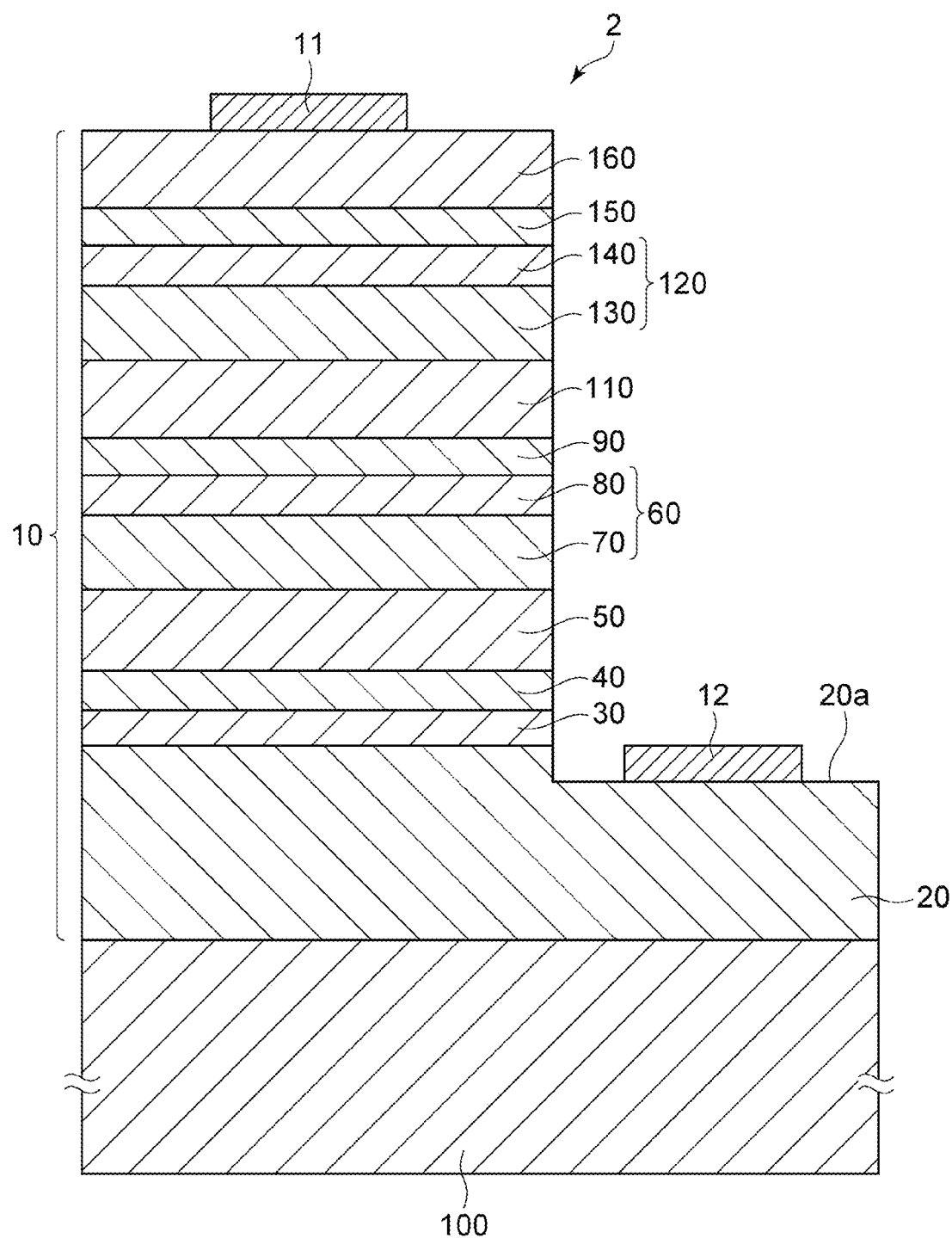
FIG. 7 is a schematic cross-sectional view of a light emitting element according to a second embodiment.

As shown in FIG. 7, a light emitting element 2 according to a second embodiment includes a substrate 100, a semiconductor structure body 10, a p-side electrode 11, and an n-side electrode 12. The light emitting element 2 of the second embodiment has practically the same structure as the light emitting element 1 of the first embodiment except for further including in the semiconductor structure body 10 a third n-side semiconductor layer 120, a third active layer 150, and a third p-side semiconductor layer 160. The third n-side semiconductor layer 120, the third active layer 150, and the third p-side semiconductor layer 160 are formed of a nitride semiconductor.

The third n-side semiconductor layer 120 is in contact with the second p-side semiconductor layer 110. The third n-side semiconductor layer 120 has a second tunnel junction layer 130 disposed in contact with the second p-side semiconductor layer 110. The second tunnel junction layer 130 in contact with the second p-side semiconductor layer 110 forms a tunnel junction with the p-side semiconductor layer 110. The third n-side semiconductor layer 120 can further have a third superlattice layer 140 disposed between the second tunnel junction layer 130 and the third active layer 150. The third superlattice layer 140 has a similar structure to that of the second superlattice layer 80. Providing a third superlattice layer 140 can reduce lattice mismatch between the second tunnel junction layer 130 and the third active layer 150, thereby reducing crystal defects in the semiconductor structure body 10.

The second tunnel junction layer 130 has a similar structure to that of the first tunnel junction layer 70. The second tunnel junction layer 130 includes an n-type layer having an n-type impurity concentration higher than the n-type impurity concentration of the third superlattice layer 140. The second tunnel junction layer 130 includes an n-type layer having an n-type impurity concentration, for example, in a range of $1\times10^{20}$/cm$^3$ to $5\times10^{21}$/cm$^3$.

The third active layer 150 is disposed on the third n-side semiconductor layer 120. The peak wavelength of the light from the third active layer 150 is longer than the peak wavelengths of the light from the first active layer 40 and the light from the second active layer 90. The third active layer 150 emits red light, for example. The peak emission wavelength of red light is from 615 nm to 750 nm.

Figure 8:
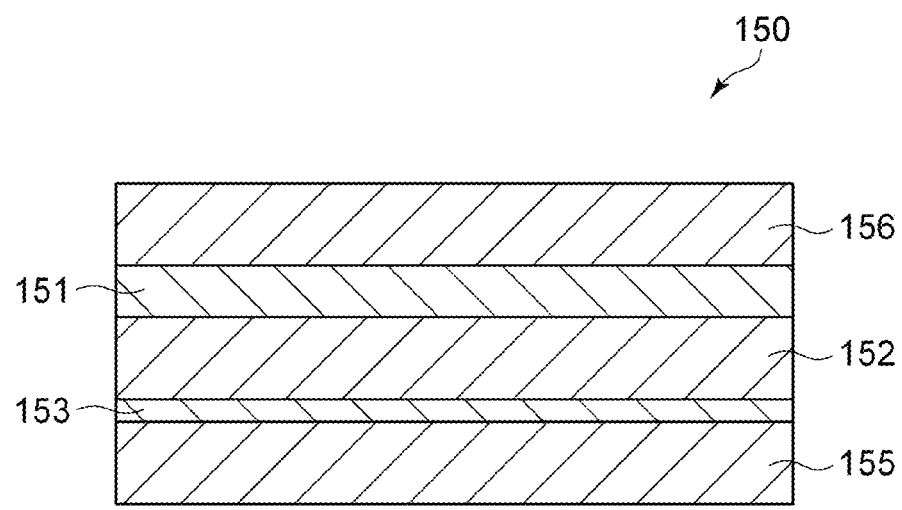
FIG. 8 is a schematic cross-sectional view explaining a third active later of the light emitting element according the second embodiment.

As shown in FIG. 8, the third active layer 150 has a third well layer 151, a second intermediate layer 153, a seventh barrier layer 152, an eighth barrier layer 155, and a ninth barrier layer 156. The third active layer 150 may have multiple pairs of a third well layer 151 and a seventh barrier layer 152. In this case, individual ones of the seventh barrier layers 152 are positioned between two adjacent third well layers 151 among the third well layers 151.

The second intermediate layer 153 is positioned closer to the second active layer 90 than the third well layer 151 is. The seventh barrier layer 152 is positioned between the third well layer 151 and the second intermediate layer 153. In the third active layer 150, the eighth barrier layer 155 is positioned as the lowermost layer, and the ninth barrier layer 156 is positioned as the uppermost layer. In the case of providing multiple pairs of a third well layer 151 and a seventh barrier layer 152, the second intermediate layer 153 is positioned between the lowermost seventh barrier layer 152 among the seventh barrier layers 152 and the eighth barrier layer 155. The third well layer 151 is positioned between the seventh barrier layer 152 and the ninth barrier layer 156. In the case of providing multiple pairs of a third well layer 151 and a seventh barrier layer 152, the uppermost third well layer 151 among the third well layers 151 is positioned between the uppermost seventh barrier layer 152 among the seventh barrier layers 152 and the ninth barrier layer 156.

The third well layer 151 contains indium. The third well layer 151 is formed, for example, of undoped indium gallium nitride. The indium composition ratio of the third well layer 151 is higher than the indium composition ratio of the second well layer 91. The indium composition ratio of the third well layer 151 can be set, for example, in a range of 25% to 40%, more preferably 30% to 35%. The thickness of the third well layer 151 can be set, for example, in a range of 2 nm to 4 nm.

The second intermediate layer 153 contains indium. The second intermediate layer 153 is formed, for example, of undoped indium gallium nitride. The indium composition ratio of the second intermediate layer 153 is lower than the indium composition ratio of the second well layer 91. The indium composition ratio of the second intermediate layer 153 can be the same as or lower than the indium composition ratio of the first intermediate layer 93. The thickness of the second intermediate layer 153 is less than the thickness of the third well layer 151.

The band gaps of the seventh barrier layer 152, the eighth barrier layer 155, and the ninth barrier layer 156 are larger than the band gap of the third well layer 151 and the band gap of the second intermediate layer 153. The seventh barrier layer 152, the eighth barrier layer 155, and the ninth barrier layer 156 are formed, for example, of gallium nitride.

The thickness of respective of the seventh barrier layer 152, the eighth barrier layer 155, and the ninth barrier layer 156 are larger than the thickness of the third well layer 151. The thickness of the seventh barrier layer 152, the thickness of the eighth barrier layer 155, and the thickness of the ninth barrier layer 156 can be set, for example, in a range of 3 nm to 15 nm.

The third p-side semiconductor layer 160 is disposed on the third active layer 150. The third p-side semiconductor layer 160 has a p-type layer containing a p-type impurity. The p-type layer of the third p-side semiconductor layer 160 contains magnesium (Mg) as a p-type impurity, for example. The third p-side semiconductor layer 160 has only to have the function of supplying positive holes, and may include an undoped layer.

A p-side electrode 11 is disposed on the upper face of the third p-side semiconductor layer 160. The p-side electrode 11 is electrically connected to the third p-side semiconductor layer 160.

A forward voltage is applied across the p-side electrode 11 and the n-side electrode 12 in a light emitting element 2 of the second embodiment. At this time, a forward current is supplied to the first active layer 40, the second active layer 90, and the third active layer 150, allowing the first active layer 40, the second active layer 90, and the third active layer 150 to emit light.

Providing a second active layer 90 on a first active layer 40, and a third active layer 150 on the second active layer 90 can increase the per unit area output as compared to a light emitting element having a single active layer or a light emitting element 1 of the first embodiment which has two active layers. The light emitting element 2 outputs mixed color light of first wavelength light (e.g., blue light) emitted by the first active layer 40, second wavelength light (e.g., green light) emitted by the second active layer 90, and third wavelength light (e.g., red light) emitted by the third active layer 150.

When a forward voltage is applied across the p-side electrode 11 and the n-side electrode 12, a reverse voltage would apply across the second n-side semiconductor layer 60 and the first p-side semiconductor layer 50 as well as across the third n-side semiconductor layer 120 and the second p-side semiconductor layer 110. The n-type layer and the p-type layer in the second n-side semiconductor layer 60 and the first p-side semiconductor layer 50 that form a tunnel junction having high impurity concentrations, as well as the n-type layer and the p-type layer in the third n-side semiconductor layer 120 and the second p-side semiconductor layer 110 that form a tunnel junction having high impurity concentrations, can reduce the width of the depletion layer formed by the junction between the second n-side semiconductor layer 60 and the first p-side semiconductor layer 50, and the width of the depletion layer formed by the junction between the third n-side semiconductor layer 120 and the second p-side semiconductor layer 110. This allows for the tunneling of electrons present in the valence band of individual ones of the p-type layers to the conduction band of individual ones of the n-type layers, thereby facilitating the current flow across the second n-side semiconductor layer 60 and the first p-side semiconductor layer 50 and across the third n-side semiconductor layer 120 and the second p-side semiconductor layer 110.

According to the second embodiment, positioning a second intermediate layer 153 between the third well layer 151 and the tunnel junction formed by the second p-side semiconductor layer 110 and the third n-side semiconductor layer 120 can increase the distance between the third well layer 151 and the tunnel-junction-forming p-type layer, thereby making it difficult for the p-type impurity (e.g., magnesium) to diffuse from the tunnel-junction-forming p-type layer to the third well layer 151. This can reduce the deterioration of the crystalline quality of the third well layer 151 attributable to the diffusion of p-type impurity thereto, thereby increasing the light output of the third well layer 151.

The second intermediate layer 153 having a band gap smaller than the band gaps of the seventh barrier layer 152 and the eighth barrier layer 155 disposed in contact with the second intermediate layer 153 as well as a thickness less than that of the third well layer 151 can achieve a tunneling effect to reduce the forward voltage. The thickness of the second intermediate layer 153 is preferably set, for example, in a range of 1 nm to 2 nm. The thickness of the second intermediate layer 153 can be set as equal to or less than the thickness of the first intermediate layer 93.

The indium composition ratio of the second intermediate layer 153 being lower than the indium composition ratio of the second well layer 91 can reduce the absorption of the light emitted from the second well layer 91 by the second intermediate layer 153. The indium composition ratio of the second intermediate layer 153 is preferably set, for example, in a range of 8% to 12%.

In order to further reduce the absorption of the light emitted from the first well layers 41 by the third active layer 150, the quantity of third well layers 151 is preferably set to be less than the quantity of first well layers 41. The quantity of third well layers 151 can be set, for example, as one.

The first active layer 40 and the second active layer 90 of a light emitting element 1 according to the first embodiment may be individually ON/OFF controlled. For example, the first active layer 40 and the second active layer 90 may be individually ON/OFF controlled by providing an electrode electrically connected to the second n-side semiconductor layer 60. The first active layer 40, the second active layer 90, and the third active layer 150 of a light emitting element 2 according to the second embodiment may be individually ON/OFF controlled. For example, the first active layer 40, the second active layer 90, and the third active layer 150 may be individually ON/OFF controlled by providing an electrode electrically connected to the second n-side semiconductor layer 60 and an electrode electrically connected to the third n-side semiconductor layer 120.

In the foregoing, certain embodiments of the present invention have been explained with reference to specific examples. The present invention, however, is not limited to these specific examples. All forms implementable by a person skilled in the art by suitably making design changes based on any of the embodiments of the present invention described above also fall within the scope of the present invention so long as they encompass the subject matter of the present invention. Furthermore, various modifications and alterations within the spirit of the present invention that could have been made by a person skilled in the art also fall within the scope of the present invention.

Embodiments of the present invention includes any of the light emitting elements described below.

[Item 1] A light emitting element comprising, successively: a first n-side semiconductor layer, a first active layer having a first well layer containing indium, a first p-side semiconductor layer, a second n-side semiconductor layer in contact with the first p-side semiconductor layer, a second active layer having a second well layer containing indium, and a second p-side semiconductor, each being formed of a nitride semiconductor, wherein the second active layer has a first intermediate layer positioned closer to the first active layer than the second well layer is and containing indium, the first well layer has a lower indium composition ratio than the indium composition ratio of the second well layer, the first intermediate layer has a lower indium composition ratio than the indium composition ratio of the first well layer, and the first intermediate layer is less in thickness than the second well layer.

[Item 2] The light emitting element according to Item 1 above, wherein the second well layers are fewer in number than the first well layers.

[Item 3] The light emitting element according to Item 1 or 2 above, wherein the second n-side semiconductor layer further includes a superlattice layer, the superlattice layer including a plurality of first layers containing indium and a second layer positioned between two adjacent first layers among the first layers, and the first layers having a lower indium composition ratio than the indium composition ratio of the first intermediate layer.

[Item 4] The light emitting element according to any of Items 1 to 3 above, wherein the quantity of second well layers is one.

[Item 5] The light emitting element according to any of Items 1 to 4 above, wherein the first intermediate layer has an indium composition ratio of 8% to 12%.

[Item 6] The light emitting element according to any of Items 1 to 5 above, wherein the first well layer has an indium composition ratio of 12% to 18%, and the second well layer has an indium composition ratio of 20% to 25%.

[Item 7] The light emitting element according to any of Items 1 to 6 above, wherein the second well layer is less in thickness than the first well layer.

[Item 8] The light emitting element according to any of Items 1 to 7 above, wherein the first intermediate layer is 1 nm to 2 nm in thickness.

[Item 9] The light emitting element according to any of Items 1 to 8 above, wherein the first well layer, the second well layer, and the first intermediate layer are formed of indium gallium nitride.

[Item 10] The light emitting element according to any of Items 1 to 9 above further comprising successively a third n-side semiconductor layer in contact with the second p-side semiconductor layer, a third active layer having a third well layer containing indium, and a third p-side semiconductor layer, each being formed of a nitride semiconductor, wherein the third active layer has a second intermediate layer positioned closer to the second active layer than the third well layer is and containing indium, the second well layer has a lower indium composition ratio than the indium composition ratio of the third well layer, the second intermediate layer has a lower indium composition ratio than the indium composition ratio of the second well layer, and the second intermediate layer is less in thickness than the third well layer.

[Item 11] The light emitting element according to Item 10 above, wherein the third well layers are fewer in number than the first well layers.

[Item 12] The light emitting element according to Item 10 or 11 above, wherein the third well layer has an indium composition ratio of 25% to 40%.

[Item 13] The light emitting element according to any of Items 10 to 12 above, wherein the second intermediate layer is 1 nm to 2 nm in thickness.

What is claimed is:

1. A light emitting element comprising:
   a first n-side semiconductor layer;
   a first active layer located above the first n-side semiconductor layer and comprising a first well layer containing indium;
   a first p-side semiconductor layer located above the first active layer;
   a second n-side semiconductor layer located above and in contact with the first p-side semiconductor layer;
   a second active layer located above the second n-side semiconductor layer, the second active layer comprising:
      a first intermediate layer located above the second n-side semiconductor layer and containing indium, and
      a second well layer located above the first intermediate layer and containing indium; and
   a second p-side semiconductor located above the second active layer, wherein:
   each of the first n-side semiconductor layer, the first active layer, the first p-side semiconductor layer, the second n-side semiconductor layer, the second active layer, and the second p-side semiconductor is formed of a nitride semiconductor,
   an indium composition ratio of the first well layer is less than an indium composition ratio of the second well layer,
   an indium composition ratio of the first intermediate layer is less than an indium composition ratio of the first well layer, and
   a thickness of the first intermediate layer is less than a thickness of the second well layer.

2. The light emitting element according to claim 1, wherein a quantity of the second well layers is less than a quantity of the first well layers.

3. The light emitting element according to claim 1, wherein:
   the second n-side semiconductor layer further comprises a superlattice layer,
   the superlattice layer comprises:
      a plurality of first layers containing indium, and
      a second layer positioned between two adjacent first layers among the first layers, and
   an indium composition ratio of the first layers is less than the indium composition ratio of the first intermediate layer.

4. The light emitting element according to claim 2, wherein the second active layer includes exactly one second well layer.

5. The light emitting element according to claim 1, wherein the indium composition ratio of the first intermediate layer is in a range of 8% to 12%.

6. The light emitting element according to claim 2, wherein the indium composition ratio of the first intermediate layer is in a range of 8% to 12%.

7. The light emitting element according to claim 3, wherein the indium composition ratio of the first intermediate layer is in a range of 8% to 12%.

8. The light emitting element according to claim 1, wherein:
the indium composition ratio of the first well layer is in a range of 12% to 18%, and
the indium composition ratio of the second well layer is in a range of 20% to 25%.

9. The light emitting element according to claim 2, wherein:
the indium composition ratio of the first well layer is in a range of 12% to 18%, and
the indium composition ratio of the second well layer is in a range of 20% to 25%.

10. The light emitting element according to claim 3, wherein:
the indium composition ratio of the first well layer is in a range of 12% to 18%, and
the indium composition ratio of the second well layer is in a range of 20% to 25%.

11. The light emitting element according to claim 1, wherein the thickness of the second well layer is less than a thickness of the first well layer.

12. The light emitting element according to claim 2, wherein the thickness of the second well layer is less than a thickness of the first well layer.

13. The light emitting element according to claim 3, wherein the thickness of the second well layer is less than a thickness of the first well layer.

14. The light emitting element according to claim 1, wherein the thickness of the first intermediate layer is in a range of 1 nm to 2 nm.

15. The light emitting element according to claim 1, wherein the first well layer, the second well layer, and the first intermediate layer are formed of indium gallium nitride.

16. The light emitting element according to claim 1 further comprising:
a third n-side semiconductor layer located above and in contact with the second p-side semiconductor layer,
a third active layer located above the third n-side semiconductor layer, the third active layer comprising:
a second intermediate layer located above the third n-side semiconductor layer, and
a third well layer located above the second intermediate layer and containing indium, and
a third p-side semiconductor layer located above the third active layer, wherein:
each of the third n-side semiconductor layer, the third active layer, and the third p-side semiconductor layer is formed of a nitride semiconductor,
the indium composition ratio of the second well layer is lower than an indium composition ratio of the third well layer,
an indium composition ratio of the second intermediate layer is lower than the indium composition ratio of the second well layer, and
a thickness of the second intermediate layer is less than a thickness of the third well layer.

17. The light emitting element according to claim 16, wherein a quantity of the third well layers is less than a quantity of the first well layers.

18. The light emitting element according to claim 16, wherein the indium composition ratio of the third well layer is in a range of 25% to 40%.

19. The light emitting element according to claim 17, wherein the indium composition ratio of the third well layer is in a range of 25% to 40%.

20. The light emitting element according to claim 16, wherein the thickness of the second intermediate layer is in a range of 1 nm to 2 nm.

21. The light emitting element according to claim 17, wherein the thickness of the second intermediate layer is in a range of 1 nm to 2 nm.

* * * * *